United States Patent
Hill et al.

(10) Patent No.: US 12,211,759 B2
(45) Date of Patent: Jan. 28, 2025

(54) CIRCUIT DIE WITH ISOLATION TEST STRUCTURE

(71) Applicant: NXP USA, Inc., Austin, TX (US)

(72) Inventors: Darrell Glenn Hill, Chandler, AZ (US); Bruce McRae Green, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 472 days.

(21) Appl. No.: 17/652,032

(22) Filed: Feb. 22, 2022

(65) Prior Publication Data

US 2023/0268237 A1 Aug. 24, 2023

(51) Int. Cl.
*H01L 23/48* (2006.01)
*H01L 21/66* (2006.01)

(52) U.S. Cl.
CPC ........... *H01L 22/32* (2013.01); *H01L 23/481* (2013.01)

(58) Field of Classification Search
CPC ........ H01L 22/32; H01L 23/481; H01L 22/34
USPC ....................................... 257/48; 438/11, 14
See application file for complete search history.

(56) References Cited

U.S. PATENT DOCUMENTS

| | | | |
|---|---|---|---|
| 7,764,078 B2 | 7/2010 | Feustel | |
| 8,324,692 B2* | 12/2012 | Chen | H01F 17/0006 257/E21.022 |
| 9,871,034 B1* | 1/2018 | Or-Bach | H01L 27/04 |
| 9,911,627 B1* | 3/2018 | Or-Bach | H01L 23/3677 |
| 10,163,878 B2* | 12/2018 | Kao | H01L 28/10 |
| 10,267,856 B2 | 4/2019 | Whetsel | |
| 2010/0295100 A1* | 11/2010 | Huang | H01L 29/812 257/256 |
| 2010/0327432 A1* | 12/2010 | Sirinorakul | H01L 23/4334 257/E23.08 |
| 2011/0254165 A1* | 10/2011 | Muranaka | H01L 23/53295 257/E23.161 |
| 2012/0037969 A1* | 2/2012 | Sanders | H01L 28/10 257/296 |
| 2012/0292757 A1* | 11/2012 | Mauder | H01L 29/78 257/774 |
| 2013/0037917 A1* | 2/2013 | Xue | H01L 23/3114 257/E23.033 |
| 2013/0115734 A1* | 5/2013 | Tan | H01L 24/48 438/106 |

(Continued)

OTHER PUBLICATIONS

U.S. Appl. No. 17/351,440; 29 pages (Jun. 18, 2021).

*Primary Examiner* — Sheikh Maruf
(74) *Attorney, Agent, or Firm* — Andrew C. Milhollin (57) ABSTRACT

An integrated circuit includes an isolation test structure (ITS) formed in a non-active region. An electrical isolation between structures of the integrated circuit may be validated based on a measured resistance or conductivity across the ITS. In some embodiments the ITS includes interdigitated buffer layer structures. In some embodiments, the ITS is arranged in series with a test Through-substrate via (TSV). The test TSV is formed with a slower etch rate and smaller diameter than other standard TSVs of the integrated circuit and can be used to validate the formation of the standard TSVs based on measured resistance or conductivity thereof. By arranging the ITS and the test TSV in series, isolation of the integrated circuit and formation of TSVs in the integrated circuit can be validated using a single measurement.

18 Claims, 4 Drawing Sheets

(56) References Cited

U.S. PATENT DOCUMENTS

| | | | |
|---|---|---|---|
| 2013/0292849 A1* | 11/2013 | Lin | H01L 21/76898 |
| | | | 257/774 |
| 2014/0145272 A1* | 5/2014 | Or-Bach | H01L 27/088 |
| | | | 257/369 |
| 2014/0287703 A1* | 9/2014 | Herbsommer | H01Q 13/02 |
| | | | 333/21 R |
| 2014/0332980 A1* | 11/2014 | Sanders | H01L 24/81 |
| | | | 257/774 |
| 2015/0076679 A1* | 3/2015 | Seng | H01L 25/0657 |
| | | | 438/108 |
| 2015/0097200 A1* | 4/2015 | Bergmann | H01L 33/50 |
| | | | 257/89 |
| 2016/0343809 A1* | 11/2016 | Green | H01L 23/66 |
| 2021/0233849 A1* | 7/2021 | Greco | H01L 23/5384 |
| 2021/0233850 A1* | 7/2021 | Greco | H01L 23/5222 |
| 2021/0233893 A1* | 7/2021 | Greco | H01L 23/5389 |
| 2021/0384168 A1* | 12/2021 | Greco | H01L 23/645 |
| 2023/0068578 A1* | 3/2023 | Yu | H01L 23/5223 |
| 2023/0085890 A1* | 3/2023 | Dabral | H01L 25/0655 |
| | | | 257/621 |

\* cited by examiner

CIRCUIT DIE WITH ISOLATION TEST STRUCTURE

TECHNICAL FIELD

Embodiments of the subject matter described herein relate generally to integrated circuits, including an isolation test structure (ITS) for an integrated circuit.

BACKGROUND

Integrated circuits find application in a wide variety of electronic components and systems. Radio frequency (RF), microwave, and millimeter wave applications sometimes include a buffer layer that attenuates the effects of the lattice mismatch between two different types of semiconductor material. Cross-wafer variation in the electrical isolation at the buffer layer in an integrated circuit can cause significant leakage current in the integrated circuit. Such leakage current typically results from non-idealities in the buffer layer, such as residual or doped impurities or point defects such as vacancies, interstitials, and anti-sites, and is indicative of poor electrical isolation.

Integrated circuits sometimes employ through-substrate vias (TSV) for electrical connections from a first side of a substrate of the integrated circuit to a second side of the substrate. Gallium nitride (GaN) devices on silicon carbide (SiC) substrates allow high frequency and high-power operation. However, SiC is difficult and time-consuming to etch, which can impact the quality of TSVs formed in SiC substrates.

SUMMARY

A brief summary of various exemplary embodiments is presented below. Some simplifications and omissions may be made in the following summary, which is intended to highlight and introduce some aspects of the various exemplary embodiments, without limiting the scope. Detailed descriptions of an exemplary embodiment adequate to allow those of ordinary skill in the art to make and use these concepts will follow in later sections.

In an example embodiment, an integrated circuit includes a substrate having a first surface and a second surface, a buffer layer disposed over the substrate, an isolation test structure that includes buffer layer structures that include a first portion of the buffer layer, and a first through-substrate via (TSV) that extends between the first surface of the substrate and the second surface of the substrate. The isolation test structure may be coupled to the first TSV.

In some embodiments, the integrated circuit includes a semiconductor device having a second portion of the buffer layer, and a resistance of the isolation test structure correlates to a resistivity of the second portion of the buffer layer.

In some embodiments, the semiconductor device includes a second TSV that extends between the first surface of the substrate and the second surface of the substrate, and a first opening in the substrate corresponding to the first TSV is smaller than a second opening in the substrate associated with the second TSV.

In some embodiments, the integrated circuit includes a reference plane disposed at the second surface of the substrate, the first TSV couples the isolation test structure to the reference plane and the second TSV couples the semiconductor device to the reference plane.

In some embodiments, the integrated circuit includes a pad disposed at the first surface of the substrate, and the isolation test structure and the first TSV are coupled in series between the pad and the reference plane. In some embodiments, the buffer layer structures of the isolation test structure include first buffer layer structures coupled to the pad and second buffer layer structures coupled to the first TSV. The first buffer layer structures and the second buffer layer structures may be interdigitated.

In some embodiments, the integrated circuit includes a fiducial marker disposed at the first surface of the substrate, and the fiducial marker overlaps the first TSV.

In an example embodiment, a test structure includes an isolation test structure disposed on a substrate. The isolation test structure includes a first buffer layer structure disposed over (e.g., on) the substrate and a second buffer layer structure disposed over (e.g., on) the substrate. The second buffer layer structure is disposed adjacent to (e.g., aligned in parallel with) the first buffer layer structure, separated from the first buffer layer structure by high resistivity material (e.g., material having a resistivity of between $10^4$ Ω-cm and $10^6$ Ω-cm or between $10^2$ Ω-cm and $10^9$ Ω-cm), and coupled to a reference plane. In some embodiments, the high resistivity material includes group III-V semiconductor material that has high resistivity due to selective ion implantation.

In some embodiments, the first buffer layer structure and the second buffer layer structure each include group III nitride material.

In some embodiments, the test structure includes a TSV that extends between the first surface of the substrate and a second surface of the substrate. The TSV may be coupled to the second buffer layer structure.

In an example embodiment, an integrated circuit includes a substrate that includes a first surface and a second surface, a buffer layer disposed over (e.g., on) the substrate, an isolation test structure that includes buffer layer structures that include a first portion of the buffer layer, and a semiconductor device that includes a second portion of the buffer layer. A resistance of the isolation test structure may correlate with a resistivity of the second portion of the buffer layer.

In some embodiments, the buffer layer includes epitaxially grown group III nitride material.

In some embodiments, the buffer layer structures include a first buffer layer structure disposed over (e.g., on) the substrate and a second buffer layer structure disposed over (e.g., on) the substrate, where the second buffer layer structure is separated from the first buffer layer structure by high resistivity material. The first buffer layer structures may be disposed adjacent to (e.g., aligned in parallel with) the second buffer layer structure.

In some embodiments, the integrated circuit includes a pad disposed at the first surface of the substrate. The pad may be coupled to the first buffer layer structure.

In some embodiments, the integrated circuit includes a first TSV that extends between the first surface of the substrate and the second surface of the substrate. The first TSV may be coupled to the second buffer layer structure.

In some embodiments, the integrated circuit includes a second TSV that extends between the first surface of the substrate and the second surface of the substrate, the first TSV is associated with a first opening in the substrate, the second TSV is associated with a second opening in the substrate, and the first opening is smaller than the second opening.

In some embodiments, the semiconductor device includes the second TSV.

In some embodiments, the integrated circuit includes a reference plane disposed at the second surface of the substrate, the first TSV couples the isolation test structure to the reference plane, and the second TSV couples the semiconductor device to the reference plane.

In some embodiments, the isolation test structure and the first TSV are arranged in series between the pad and the reference plane.

In some embodiments, the integrated circuit includes a fiducial marker disposed at the first surface of the substrate in contact with and overlapping the first TSV.

BRIEF DESCRIPTION OF THE DRAWINGS

A complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

When fabricating integrated circuit devices, it is sometimes desirable to utilize more than one semiconductor material. In some instances, a first semiconductor material is epitaxially grown on a bulk substrate formed from a second semiconductor material. For example, gallium nitride (GaN) devices on silicon carbide (SiC) substrates are sometimes fabricated via epitaxial growth of one or more GaN layers on a SiC bulk substrate. GaN-on-SiC devices are suitable for high frequency and high-power operation, for example. While the lattice structure of SiC is relatively similar to that of GaN, a lattice mismatch exists between GaN and SiC. In order to attenuate the effects of the lattice mismatch between SiC and GaN, it may be desirable to provide a buffer layer (e.g., an epitaxially-grown buffer layer, sometimes referred to as an "epitaxial buffer layer") as an interface between a SiC substrate and GaN layers grown or otherwise disposed thereon. In active GaN-on-SiC devices, such as GaN radio frequency (RF) power transistors, the quality of electrical isolation between structures, such as buffer layer structures, of such devices impacts product performance. For example, even slight cross-wafer variation in the electrical isolation at the buffer layer may result in devices ultimately failing final testing (after costs associated with packaging individual devices have already been incurred), since the level of isolation between structures of the buffer layer correlates negatively with leakage current.

Conventional techniques for validation and characterization of electrical isolation (sometimes referred to herein as "isolation validation" or "isolation characterization", respectively) of active devices in integrated circuits involve estimating electrical isolation between active device structures for entire regions of a wafer on which multiple integrated circuit die are fabricated, rather than for individual integrated circuit die on the wafer. It should be noted that the terms "electrical isolation" and "isolation" are used interchangeably herein. In such conventional techniques, the isolation characterization for a region of the wafer is performed based on process control monitoring (PCM) data (e.g., using contour maps derived from the PCM data), and integrated circuit die are rejected in regions of the wafer that are estimated to have unacceptable isolation properties. However, such conventional techniques can be imprecise, resulting in misidentification of good-versus-bad integrated circuit die, resulting in adverse implications for product cost due to rejecting good die as well as accepting bad die (which are typically rejected at the final testing stage, following costly packaging procedures). Embodiments described herein relate to an isolation testing structure (ITS) that is included in an individual integrated circuit die in order to validate the isolation. For example, each integrated circuit die fabricated on a given wafer includes an ITS, and the resistance of the ITS is measurable using a probe station and ohmmeter (e.g., using a unit probe module), such that isolation validation can be performed for each individual integrated circuit die on the wafer. By including an ITS in each integrated circuit die that can be validated using a unit probe module, individual integrated circuit die with unacceptable isolation (e.g., measured conductivity or resistivity outside of an acceptable range) may be identified on-wafer and rejected prior to packaging of the individual integrated circuit die, which can reduce product cost compared to conventional isolation validation techniques.

In some embodiments, one or more TSVs are formed in a substrate (e.g., a SiC substrate) by an etching process where a lithographic mask is formed on a first surface such as a lower surface of the substrate and the substrate is etched by an etching material from the first surface to a second surface such as an upper surface of the substrate. The mask may have patterns of a first set of openings, each of a first size, so that the etching material of the etching process etches the substrate for a period of time long enough at the openings to form standard TSVs at the first set of openings. In some embodiments, the mask additionally includes a second set of openings of a second size, smaller than the first size, so that the etching material of the etching process etches the substrate to form test TSVs at the second set of openings. An etch rate is defined as a rate by which a depth of a hole in the substrate increases as a function of time and typically depends on how deep the hole is and a size of an opening.

In some embodiments, the etching process forms multiple standard and test TSVs in the substrate via the sets of openings in the mask. In some instances, at least some of the TSVs are not properly formed because of varying thickness of the substrate or contamination of the etching material, either of which inhibits the ability of the etching material to etch from the first surface to the second surface. Due to uncertainty regarding whether a TSV is fully formed (that is, whether the opening in the substrate associated with the TSV fully extends through the substrate), it may be desirable to validate the formation of one or more TSVs of a given integrated circuit die.

In some embodiments, TSVs are used to connect source structures of transistors (disposed at or near the first surface of the substrate) to a reference potential at the second surface of the substrate of the integrated circuit die. For example, a transistor (e.g., a field effect transistor, such as a GaN RF power transistor) has a drain structure, gate structure, and source structure, each formed at or below the second surface of the substrate. At least one TSV electrically connects the source structure electrically conductive material disposed on the second surface, where, during operation, the electrically conductive material is biased to a reference potential, such as a ground voltage. This electrically conductive material disposed at the second surface of the substrate is sometimes referred to herein as a "reference plane".

Some embodiments disclosed herein relate to validating that one or more standard TSVs (e.g., a TSV with a specific configuration that connects a source structure to a reference plane) are properly formed based on formation of a test TSV (i.e., a TSV that has a configuration that is different from the configuration of a standard TSV). Each TSV, when appropriately formed, provides an electrical connection between the first side of the substrate and the second side of the substrate. The test TSV is an undersized TSV compared to the standard TSV. For example, the opening in the substrate formed by the test TSV is smaller than that formed by the standard TSV. Both the standard TSV and test TSV are formed by an etching process. Since an etch rate depends on the size of the opening in the mask, if a non-standard opening in the mask used to form the test TSV is smaller (e.g., having a smaller diameter) than a standard opening in the mask used to form the standard TSV, then the etch rate will be lower for the non-standard opening compared to the standard opening. In some embodiments, the size of the non-standard opening and duration of the etching is chosen based on empirical testing. If the test TSV is properly formed (i.e., the TSV extends completely through the substrate) then the standard TSV is likely also properly formed because the standard opening of the standard TSV is larger and has a faster etch rate than the non-standard opening of the test TSV. A conductive material is then arranged within the openings of the standard and test TSVs to form respective conductive paths between the first surface to the second surface. Herein, the term "conductive material" refers to electrically conductive material, such as gold, copper, aluminum, titanium, nickel, indium-tin-oxide (ITO), or the like.

In some embodiments, a test process validates formation of one or more standard TSVs based on validating formation of the test TSV. For example, the test process includes electrically connecting a first probe to a first top-side pad (TSP) at the first surface of the substrate and electrically connecting a second probe to a second TSP at the first surface which is electrically connected to the second surface. Herein, a TSP refers to conductive material at the first surface of the wafer that is dimensioned, for example, to accommodate at least one probe. In some embodiments, preceding the test process, the second surface of the substrate is etched at an opening of a mask to attempt to form a test TSV, then the conductive material is deposited in the etched portion of the substrate. In some embodiments, a measurement device, such as an ohmmeter, measures resistance between the first probe to the second probe (effectively measuring the resistance through the test TSV) to determine whether the measured resistance is less than a threshold amount. The nominal resistance of a properly formed test TSV is around 0.005Ω, for example. In some embodiments, if the measured resistance across the test TSV is relatively high (e.g., higher than around $10^9 \Omega$; effectively open), this indicates that the test TSV and standard TSVs proximate to the test TSV likely fail to extend fully through the substrate, and the formation of these TSVs is incomplete. If the measured resistance across the test TSV is relatively low (e.g., lower than around $10^9 \Omega$), this indicates that the test TSV and standard TSVs proximate to the test TSV likely extend fully through the substrate and are fully formed. In some embodiments, conductivity through the test TSV is measured (e.g., using a conductivity meter), rather than resistance, with measured conductivity above a predetermined threshold conductivity value indicating successful formation of the test TSV and standard TSVs proximate to the test TSV, and measured conductivity below the predetermined threshold conductivity value indicating unsuccessful formation of the test TSV and standard TSVs proximate to the test TSV. In some embodiments, the test TSV is co-located with a fiducial marker of the integrated circuit die.

In some embodiments, an integrated circuit die includes an ITS and a test TSV that are coupled in series between a topside pad at a first surface of the integrated circuit die and a reference plane (e.g., a conductive layer that, in some embodiments, is coupled to a reference potential such as a ground voltage) at a second surface of the integrated circuit die. By arranging the ITS and the test TSV to be connected in series, the combined series resistance or conductivity through both the ITS and the test TSV can be measured, allowing for simultaneous validation of the isolation and standard TSVs using the ITS and the test TSV.

Figure 1:
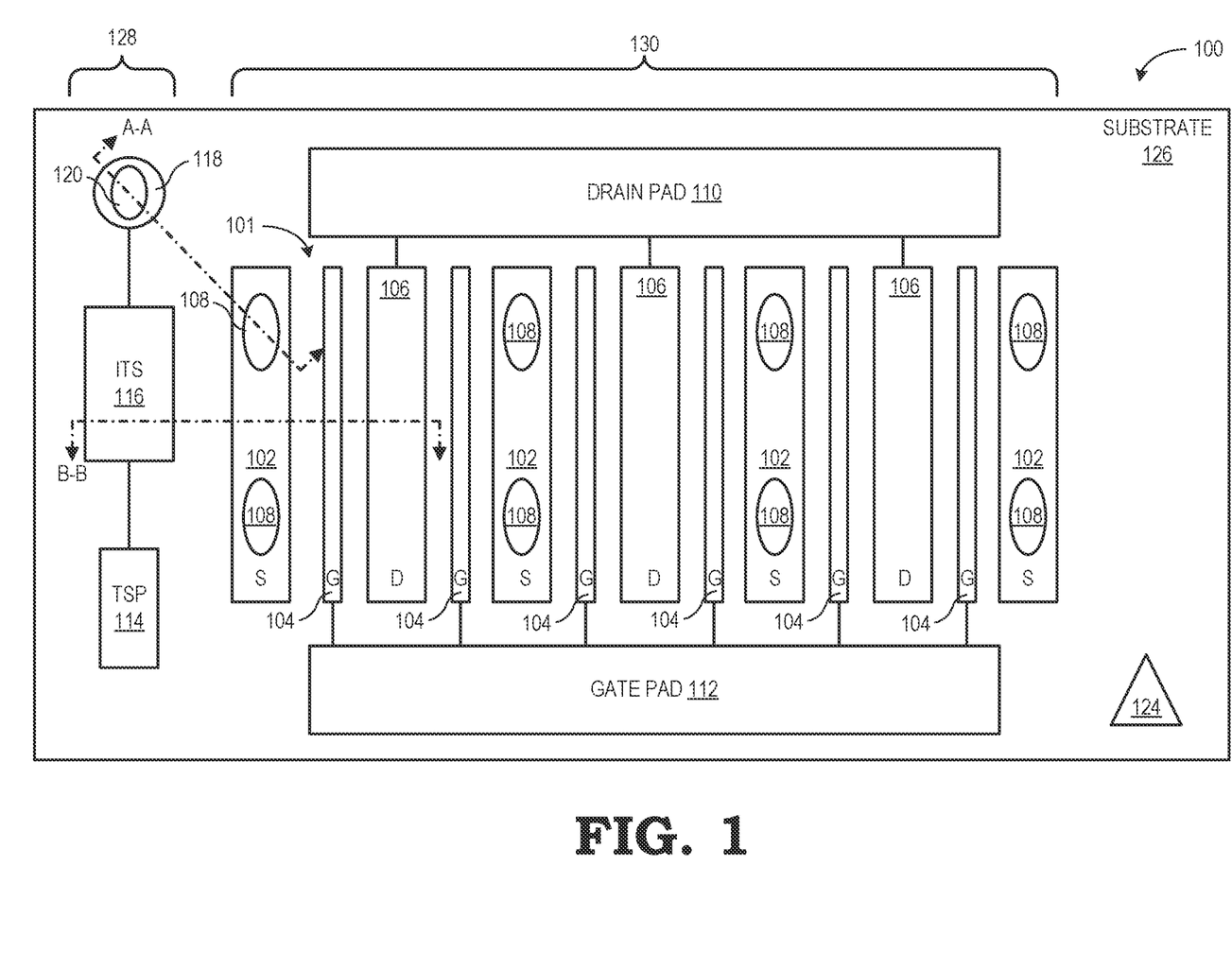
FIG. 1 is a top view of an example integrated circuit according to an embodiment.

FIG. 1 is an example top view of an example integrated circuit 100 in accordance with an embodiment. In some embodiments, the integrated circuit 100 may include a substrate 126 that completely or partially composed of a semiconductor material such as silicon carbide (SiC) or other suitable semiconductor materials. In other embodiments, the substrate 126 may include other materials such as sapphire, silicon (Si), gallium nitride (GaN), aluminum nitride (AlN), diamond, boron nitride (BN), poly-SiC, silicon on insulator, gallium arsenide (GaAs), indium phosphide (InP), and other substantially insulating or high resistivity materials.

The integrated circuit 100 may include one or more test structures, such as an ITS 116 and a test TSV 120. As will be described the combined resistivity or conductivity of the ITS 116 and the test TSV 120 may be measured to validate isolation of the integrated circuit 100 and TSVs (e.g., the standard TSVs 108) of the integrated circuit 100 via a single measurement. In some embodiments, the ITS 116, the test TSV 120, and the TSP 114 collectively form a test structure.

The buffer layer may be formed at a first surface of the substrate 126. In some embodiments, the buffer layer includes one or more layers of group-III nitride epitaxially grown layers, Si, GaAs, InP, or other suitable materials. For embodiments in which the buffer layer includes group-III nitride layers, such layers may be nitrogen (N)-face or Gallium (Ga)-face material, for example. In some embodiments, the buffer layer includes at least one aluminum gallium nitride (AlGaN) mixed crystal layer. In some embodiments, the buffer layer includes an AlN layer disposed between the other layers of the buffer layer and the substrate 126, which acts as a nucleation region.

The integrated circuit 100 may include one or more active semiconductor devices, such as transistors, in an active region 130 at a first surface of the integrated circuit 100. The active semiconductor devices in the active region 130 may include, for example, a transistor 101. The transistor 101 may be a GaN field effect transistor (FET) defined by multiple structures (sometimes referred to as "fingers") such as a source structure 102 ("S"), a gate structure 104 ("G"), and a drain structure 106 ("D"), where each of the source structure 102, the gate structure 104, and the drain structure 106 are each respectively formed from conductive material (e.g., gold, copper, titanium, aluminum, nickel, and/or the like) disposed at the first surface of the integrated circuit 100. One or more layers of GaN material (sometimes referred to as "GaN layers") may be disposed between the substrate 126 and each of the source structures 102, the gate structures 104, and the drain structures 106. For example, such GaN layers may be epitaxially grown on the substrate 126 or on a buffer layer disposed over (e.g., on) the substrate 126. The drain structure 106 of the transistor 101 may be electrically coupled to a drain pad 110 (e.g., a drain bond pad), and the gate structure 104 of the transistor 101 may be electrically coupled to a gate pad 112 (e.g., a gate bond pad). For example, each of the gate pad 112 and the drain pad 110 includes conductive material disposed at the first surface of the integrated circuit 100. In some embodiments, wire bonds are used to connect the drain pad 110 to the drain structures 106 and to connect the gate pad 112 to the gate structures 104. The source structure 102 of the transistor 101 may be electrically coupled to a layer of electrically conductive material, sometimes referred to herein as a "reference plane" (e.g., the reference plane 206 of FIG. 2), that is disposed at the second surface of the integrated circuit 100 and that, during operation, is configured to be biased to a reference potential such as a ground voltage. As shown, the active region 130 may include multiple source structures 102, gate structures 104, and drain structures 106, which collectively form multiple transistors. In some embodiments, the active region 130 may include other active devices in place of or in addition to the transistors shown in the present example.

In some embodiments, the source structures 102 are each coupled to the reference plane by through-substrate vias (TSVs) 108. Each standard TSV 108 corresponds to an opening (e.g., hole) in the substrate 126 that extends between one of the source structures 102 and the reference plane and that includes conductive material that provides an electrical connection between that source structure 102 and the reference plane.

The integrated circuit 100 may include a non-active region 128 adjacent to the active region 130. In the present example, the non-active region 128 includes a TSP 114, an ITS 116, and a pad 118 that is collocated with a test TSV 120. The ITS 116 and the test TSV 120 are coupled in series between the TSP 114 and the reference plane of the integrated circuit 100. The TSP 114 may include a conductive layer disposed at a first surface of the substrate 126, for example.

The ITS 116 may include, for example, multiple interdigitated buffer layer structures. In some embodiments, each buffer layer structure of the ITS 116 is formed concurrently with (e.g., in the same processing step as) a corresponding buffer layer in the active region 130. In some embodiments, the dimensions of the interdigitated buffer layer structures of the ITS 116 and the separation between such structures is set such that one or more properties (e.g., resistance, conductivity, current leakage, or the like) of the ITS 116 is correlated with one or more corresponding properties of a buffer layer in the active region 130, such as a buffer layer included by the transistor 101. The dimensions and separation of the buffer layer structures of the ITS 116 are determined experimentally or via modeling, according to various embodiments. For example, each buffer layer structure of the ITS 116 may be around 100 μm in width and may be separated from the next nearest buffer layer structure of the ITS 116 by around 5 μm. By arranging the buffer layer structures of the ITS 116 to correlate to the buffer layer of the active region 130 in this way, the isolation of the active region 130 can be validated by measuring properties (e.g., resistance, conductivity) of the ITS 116.

The test TSV 120 may be collocated with the pad 118 and may electrically connect the pad 118 to the reference plane of the integrated circuit 100. The pad 118 may be disposed at the first surface of the substrate 126, while the reference plane may be disposed at a second surface of the substrate 126 that is opposite the first surface. Both the standard TSVs 108 and the test TSV 120 are, for example, formed by etching openings in the second surface of the substrate 126. For example, during fabrication of the standard TSVs 108 and the test TSV 120, a mask (e.g., a patterned layer of photoresist, for embodiments in which the TSVs are formed via a lithographic process) may be applied at the second surface of the substrate 126. The mask includes first set of openings, each having a first diameter, and second set of openings, each having a second diameter, where the second diameter is smaller than the first diameter. Etchant material is provided in the first and second sets of openings of the mask, which etches corresponding regions of the substrate 126 to form a first set of holes and a second set of holes (sometimes referred to as "openings") in the substrate 126, respectively. An etch rate may define a depth by which a given hole is etched in the substrate 126 per unit time. Since an etch rate depends on the size or area of the opening in the mask through which the etchant material is applied to the substrate 126, the first set of holes formed at the first set of openings of the mask will have a larger area than that of the second set of holes formed at the second set of openings of the mask, all other things being equal, because the first diameter of the first set of openings of the mask is larger than the second diameter of the second set of openings of the mask. The difference in diameter between the first set of openings of the mask and the second set of openings of the mask also results in the openings of the standard TSVs 108 each being larger (e.g., wider and potentially deeper) than the opening of the test TSV 120. The diameters of the first and second sets of openings of the mask and the duration of etching may be chosen based on empirical testing, such that if the test TSV 120 is successfully formed (i.e., the test TSV 120 extends fully through the substrate 126 from the first surface to the second surface) then the standard TSVs 108 are likely also be successfully formed because the holes associated with the standard TSVs 108 are formed more quickly than that of the test TSV 120 due to their larger area and faster etch rate.

After the etching, conductive material is deposited or otherwise disposed in the openings in the substrate 126 formed by the etching process in order to form the standard TSVs 108 and the test TSV 120. In the test TSV 120, this conductive material extends between and electrically connects the pad 118 and the reference plane. The conductive material in a given standard TSV 108 extends between and electrically connects a source structure 102 and the reference plane. It should be noted that the presence of an electrical connection between the source structure 102 and the reference plane through the standard TSVs 108 or an electrical connection between the pad 118 and the reference plane is dependent on these TSVs having been properly formed (i.e., the TSVs extending fully through the substrate 126). Because the etch rate used to form the opening of the test TSV 120 is slower than the etch rate used to form the openings of the standard TSVs 108, each of the test TSV 120 and the standard TSVs 108 can be validated via a single measurement of the resistance or conductivity of the test TSV, for example. That is, it can be inferred that if the test TSV 120 was successfully formed, then the standard TSVs 108 should also be successfully formed due to their openings having been etched at a comparatively faster rate.

As indicated above, the ITS 116 and the test TSV 120 are coupled in series between the reference plane of the integrated circuit 100 and the TSP 114, such that the combined resistance or conductivity of the ITS 116 and the test TSV 120 can be determined via a single measurement. By measuring the combined resistance or conductivity of the ITS 116 and the test TSV 120, the isolation of the integrated circuit 100 (e.g., isolation at the buffer layer of one or more active devices, such as the transistor 101, in the active region 130 of the integrated circuit 100) can be validated.

For example, a validation process may be performed to validate the isolation and TSVs of the integrated circuit 100. This validation process may be performed while the integrated circuit 100 is still on-wafer, prior to die cutting and packaging, for example. During the validation process, a probe may be electrically connected to the TSP 114. Test equipment, such as an ohmmeter or a conductivity meter, is electrically connected to the probe and, separately, to the reference plane of the integrated circuit 100. In some embodiments, an electrically conductive chuck of a probe station may provide a connection between the test equipment and the reference plane. In some embodiments, a second probe may be electrically connected between a second TSP (not shown; disposed, for example, at the first surface of the substrate 126) and the test equipment to provide a connection between the reference plane and the test equipment, where the second TSP is coupled to the reference plane through a standard TSV. The test equipment may measure the resistance, conductivity, or both between the probe and the reference plane, effectively measuring the combined resistance and/or conductivity of the ITS 116 and the test TSV 120. The integrated circuit 100 either passes validation (at least for the current validation process) or fails validation based on this measurement. For an example embodiment in which the test equipment measures the series resistance of the ITS 116 and the test TSV 120, the resultant resistance measurement is compared to predetermined thresholds to determine whether the integrated circuit 100 passes or fails validation.

In some embodiments, in order to satisfy operating requirements, acceptable electrical isolation between active device structures of the integrated circuit 100 may correspond to a range (e.g., approximately $10^7 \Omega$ for the lower limit of the range and approximately $10^9 \Omega$ for the upper limit of the range), of acceptable resistance values of the ITS 116. When properly formed, the nominal resistance of the test TSV 120 (e.g., around $5 \times 10^{-3} \Omega$) is several orders of magnitude lower than the lower limit resistance for the ITS 116. When improperly formed, the resistance of the test TSV 120 is effectively an open circuit and is therefore significantly higher than the upper limit resistance for the ITS 116. Thus, when the test TSV 120 is properly formed, its contribution to the measured series resistance is comparatively low, and when the test TSV 120 is improperly formed, the measured series resistance will be similar to that of an open circuit. So, if the measured series resistance of the ITS 116 and the test TSV 120 is below the lower limit resistance for the ITS 116, this is indicative of unacceptably low isolation, and the integrated circuit 100 fails validation. If the measured series resistance of the ITS 116 and the test TSV 120 is between the lower limit resistance and the upper limit resistance for the ITS 116, this is indicative that the integrated circuit 100 likely has an acceptable isolation and that the TSVs of the integrated circuit 100 are likely properly formed, and the integrated circuit 100 passes validation. If the measured series resistance of the ITS 116 and the test TSV 120 is higher than the upper limit resistance for the ITS 116, this is indicative of the TSVs of the integrated circuit 100 being improperly formed (not fully etched), and the integrated circuit 100 fails validation.

In an example, if the measured series resistance is less than a first resistance threshold of $10^7 \Omega$, the integrated circuit 100 may fail validation due to high leakage current (e.g., between gate structure 104 and drain structure 106) caused by low isolation. If the measured series resistance is between the first resistance threshold of $10^7 \Omega$ and a second resistance threshold of $10^9 \Omega$, the integrated circuit 100 may pass validation. If the measured series resistance is above the second resistance threshold of $10^9 \Omega$, the integrated circuit 100 may fail validation due to improperly formed TSVs.

While the validation process of the preceding example is described with respect to series resistance measurements across the ITS 116 and the test TSV 120, it should be understood that series conductivity measurements could instead be performed using the test equipment, with measured series conductivity being compared to corresponding conductivity thresholds to validate the isolation and TSVs of the integrated circuit 100.

Because the integrated circuit 100 includes the ITS 116 and the test TSV 120 arranged in series, validation of both the isolation of the integrated circuit 100 and the TSVs of the integrated circuit 100 can be performed using a single measurement, which reduces time needed to validate the integrated circuit 100 (e.g., compared to the time that would be required to validate the isolation and the TSVs of the integrated circuit 100 separately). Additionally, by including the ITS 116 in the integrated circuit 100, on-wafer per-device validation of the multiple such integrated circuits can be performed, which provides better precision and accuracy for distinguishing between valid and invalid devices compared to conventional validation techniques that rely on characterizing entire regions of a wafer based on PCM data and associated contour maps.

The integrated circuit 100 may include one or more fiducial markers, such as a fiducial marker 124, at its first surface. In some embodiments, the pad 118 is a fiducial marker and may have a substantially circular perimeter as shown in the present example or, alternatively, a perimeter corresponding to another shape, such as a triangle, square, or cross. Fiducial markers, such as the fiducial marker 124 and some embodiments of the pad 118, may be used to align the integrated circuit 100 during fabrication or packaging, for example. Co-locating the test TSV 120 with a fiducial marker, such as the pad 118 in some embodiments, preserves die area of the integrated circuit 100 (e.g., compared to providing a pad for the test TSV 120 that is formed separately from a fiducial marker).

While in the present example the ITS 116 and the test TSV are connected in series between the TSP 114 and the reference plane such that the combined resistance or conductivity of both the ITS 116 and the test TSV 120 is measured, other arrangements of these elements may be used in alternative embodiments so that the resistance or conductivity of the ITS 116, the test TSV 120, or both can be individually measured. In an example, the ITS 116 is coupled between the TSP 114 and an additional TSP, such that a first probe in contact with the TSP 114 and a second probe in contact with the additional TSP can be used in conjunction with an ohmmeter or a conductivity meter to determine the resistance or conductivity through the ITS 116 (e.g., to validate the isolation of the integrated circuit 100). In an example, the pad 118 is only electrically connected to the reference plane through the test TSV 120 and is not electrically connected to the ITS 116, such that a first probe in contact with the pad 118 and a second probe in contact with the TSP 122 can be used in conjunction with an ohmmeter or a conductivity meter to determine the resistance or conductivity through the test TSV 120 (e.g., to validate the TSVs in the integrated circuit 100).

Figure 2:
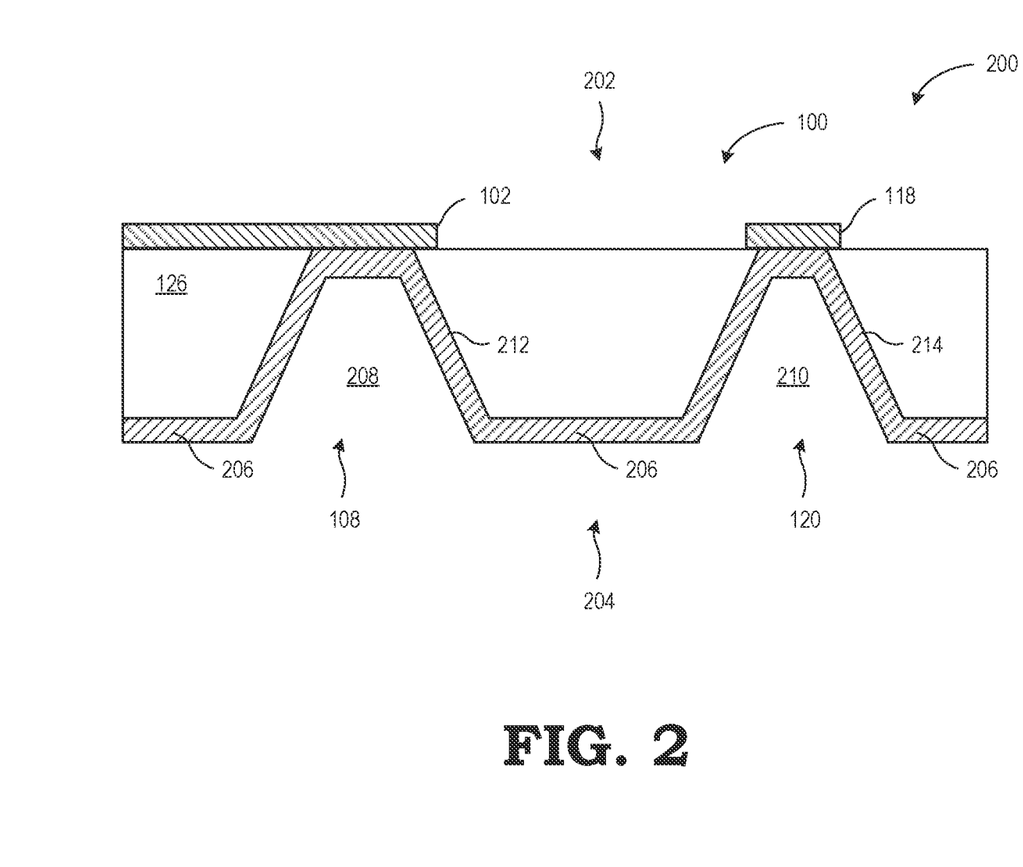
FIG. 2 is an example cross-sectional view of standard and test through-substrate vias (TSVs) in an integrated circuit, such as the integrated circuit of FIG. 1, according to an embodiment.

FIG. 2 is a cross-sectional view 200 of an example embodiment of the integrated circuit 100 of FIG. 1, in accordance with an embodiment. For example, the cross-sectional view 200 may be along line A-A shown in FIG. 1. In FIG. 2, like reference numerals are used to denote similar elements in FIG. 1, and some details already discussed above in conjunction with such elements are not reiterated here for brevity.

In the present example, the substrate 126 includes a first surface 202 and a second surface 204. The pad 118 and the source structure 102 are disposed on the first surface of the substrate 126. A reference plane 206 is disposed on the second surface of the substrate 126. In some embodiments, the reference plane includes conductive material, such as gold or copper, that formed (e.g., deposited) on the second surface of the substrate 126. During operation of the integrated circuit 100, the reference plane 206 may be biased to a reference potential, such as a ground voltage. The standard TSV 108 includes an opening 208 (formed, for example, using an etching process, as described above) and conductive material 212 that covers surfaces of the substrate 126 within the opening 208 and that electrically connects the source structure 102 to the reference plane 206. That is, surfaces of the substrate 126 within the opening 208 are lined with the conductive material 212. The test TSV 120 includes an opening 210 (formed, for example using an etching process, as described above) and conductive material 214 that covers surfaces of the substrate 126 within the opening 210 and that electrically connects the pad 118 to the reference plane 206. That is, surfaces of the substrate 126 within the opening 210 are lined with the conductive material 214. As shown, the opening 208 of the standard TSV 108 is larger than the opening 210 of the test TSV 120 due to, for example, a first opening in the mask used to form the standard TSV 108 during the etching process being larger than a second opening in the mask used to form the test TSV 120 during the etching process, resulting in a faster etch rate for the formation of the opening 208 of the standard TSV 108. Because the etch rate for the formation of the opening 208 of the standard TSV 108 is faster than the etch rate for the formation of the opening 210 of the test TSV 120, there is a high likelihood that, if the test TSV 120 is properly formed (e.g., fully extending through the substrate 126 to provide an electrical connection between the first surface 202 and the second surface 204), then the standard TSV 108 is also properly formed. Thus, by validating the test TSV 120, therefore, standard TSVs in the integrated circuit 100, such as the standard TSV 108, can be implicitly validated.

Figure 3:
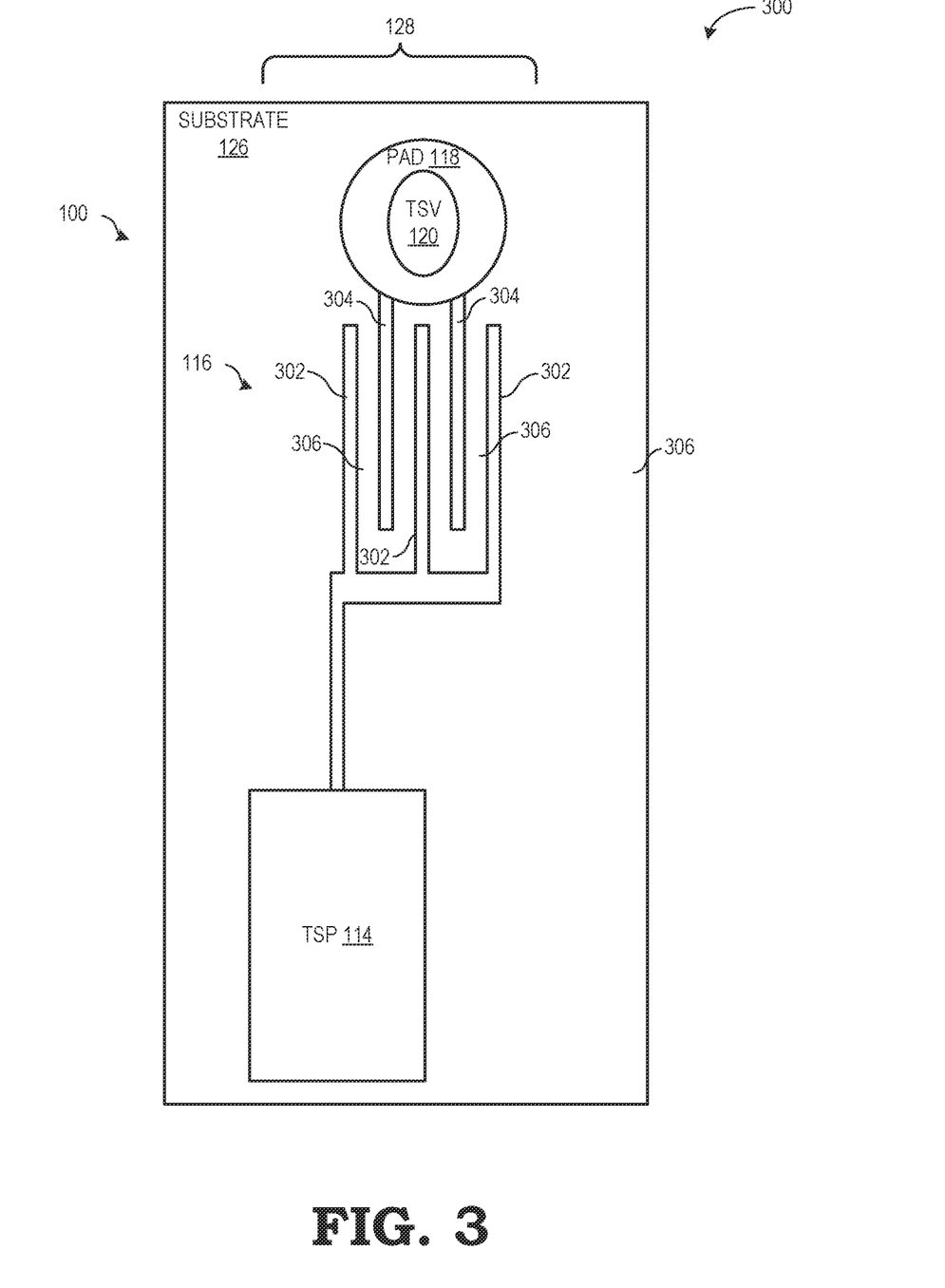
FIG. 3 is a top view of a non-active region of an integrated circuit, such as an embodiment of the integrated circuit of FIG. 1, that includes an example isolation test structure (ITS) according to an embodiment.

FIG. 3 is a top view 300 of the non-active region 128 of an example embodiment of the integrated circuit 100, in accordance with an embodiment. In FIG. 3, like reference numerals are used to denote similar elements in FIG. 1, and some details already discussed above in conjunction with such elements are not reiterated here for brevity.

As shown in the present example, the non-active region 128 of the integrated circuit 100 includes the TSP 114, the ITS 116, and the pad 118, which is collocated with the test TSV 120. The TSP 114 and the pad 118 are formed on a first surface (e.g., the first surface 202 of FIG. 2) of the substrate 126. The test TSV 120 includes an opening (e.g., the opening 210 of FIG. 2) that extends completely through the substrate 126 when properly formed and includes conductive material (e.g., conductive material 214 of FIG. 2) that electrically connects the pad 118 to a reference plane (e.g., the reference plane 206 of FIG. 2) of the integrated circuit 100.

The ITS 116 includes first buffer layer structures 302 and second buffer layer structures 304. In the present example, the first buffer layer structures 302 and the second buffer layer structures 304 are interdigitated.

The respective dimensions and arrangement (e.g., interdigitation and separation) of the first buffer layer structures 302 and the second buffer layer structures 304 cause the resistance (or conductivity) across the ITS 116 to correlate to the isolation in other devices (e.g., active devices in the active region 130 of FIG. 1). For example, each buffer layer structure of the ITS 116 may be around 100 μm in width and may be separated from the next nearest buffer layer structure of the ITS 116 by around 5 μm. Separation (and electrical isolation) between adjacent structures of the first buffer layer structures 302 and the second buffer layer structures 304 may be provided by high resistivity material 306 that is interposed between such adjacent structures. In some embodiments, the high resistivity material 306 laterally surrounds some or all of the buffer layer material (including the first buffer layer structures 302 and second buffer layer structures 304) of the ITS 116. The high resistivity material 306 may have a resistivity of between $10^4$ Ω-cm and $10^6$ Ω-cm, for example. In other embodiments, the high resistivity material 306 may have a resistivity of between $10^2$ Ω-cm and $10^9$ Ω-cm, although other higher or lower resistivity values may be used. In some embodiments, the dimensions and arrangement of the first and second buffer layer structures 302 and 304 of the ITS 116 are determined experimentally or via modeling. In some embodiments, instead of the interdigitated buffer layer test structures shown in the present example, the ITS 116 includes a first buffer layer structure (e.g., a first strip of buffer layer material) that is coupled to the TSP 114 and a second buffer layer structure (e.g., a second strip of buffer layer material) that is coupled to the test TSV 120, where the first buffer layer structure and the second buffer layer structure are disposed adjacent to one another (e.g., aligned in parallel with one another) and spaced approximately 5 μm apart from one another, separated by high resistivity material 306.

In view of the correlation between the level of isolation at the buffer layer and the resistance of the ITS 116, the isolation of the integrated circuit 100 is likely valid if the resistance across the ITS 116 is within a predetermined range (e.g., between approximately $10^7 Ω$ to approximately $10^9 Ω$). Outside of this range, issues, such as excessive leakage current, may impact operation of the integrated circuit 100. Thus, by measuring the resistance across the ITS 116, the isolation of the integrated circuit 100 can be validated.

As indicated above, the ITS 116 and the test TSV 120 are coupled in series between the reference plane of the integrated circuit 100 and the TSP 114, such that the combined resistance or conductivity of the ITS 116 and the test TSV 120 can be determined via a single measurement. For example, the first buffer layer structures 302 are connected to the TSP 114 and the second buffer layer structures 304 are connected to the pad 118 and/or the test TSV 120. By measuring the combined resistance or conductivity of the ITS 116 and the test TSV 120, the isolation of the integrated circuit 100 can be validated using, for example, the validation process described above in connection with FIG. 1.

As indicated above, by arranging the ITS 116 and the test TSV 120 in series, validation of both the isolation of the integrated circuit 100 and the TSVs of the integrated circuit 100 can be performed using a single measurement, which reduces the time required to validate the integrated circuit 100. Additionally, on-wafer per-device validation can be performed because the ITS is included in the integrated circuit 100, which provides better validation precision and accuracy compared to conventional validation techniques.

While the first buffer layer structures 302 and the second buffer layer structures 304 of the ITS 116 are shown in the top view 300 to illustrate their position, in some embodiments, these and other buffer layer structures of the ITS 116 may be disposed under one or more layers (e.g., insulation layers) of the integrated circuit 100 and are, therefore, not visible when viewing the integrated circuit 100 from the current perspective.

Figure 4:
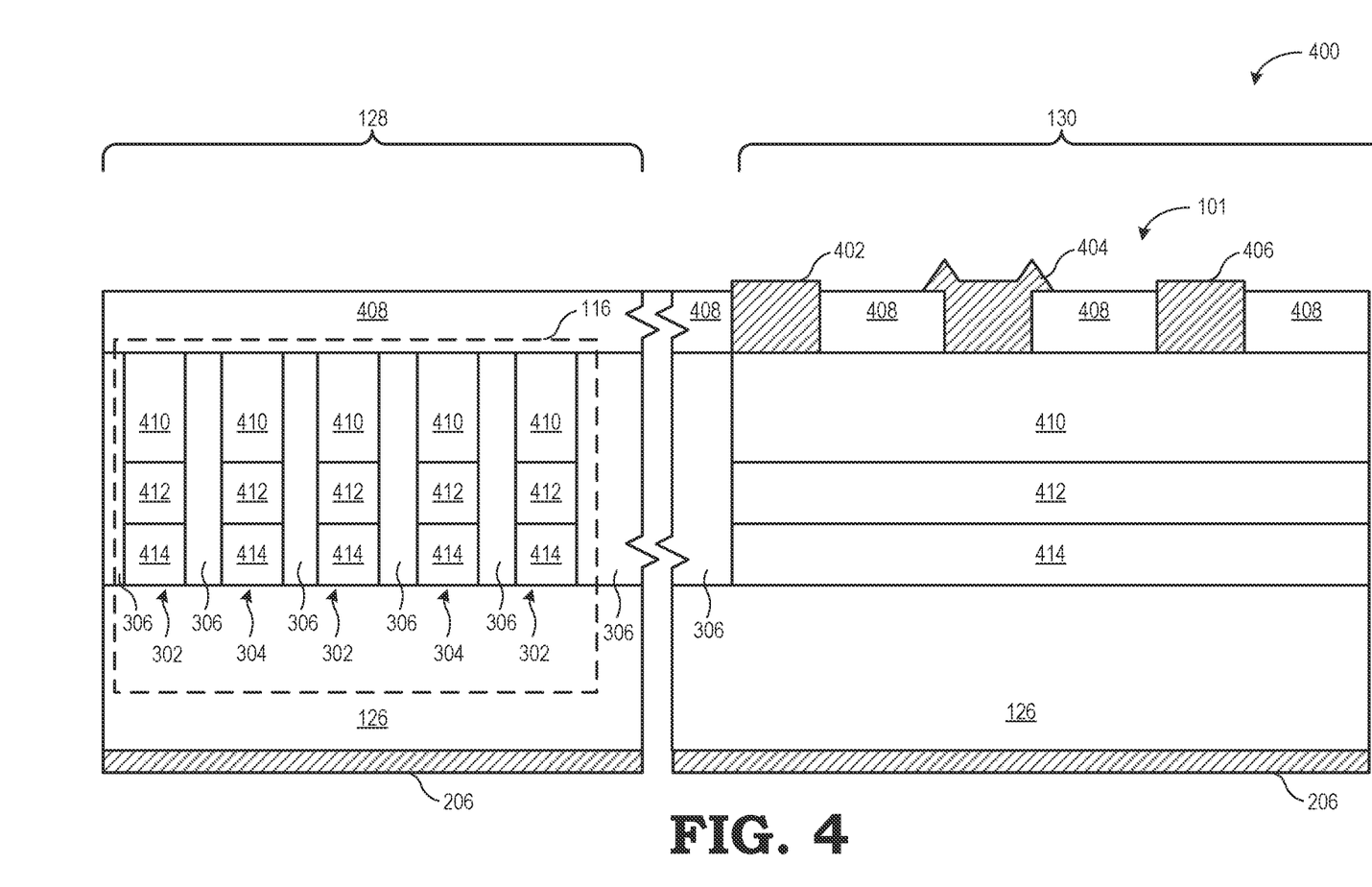
FIG. 4 is an example cross-sectional view of a non-active region and an active region of an integrated circuit, such as an embodiment of the integrated circuit of FIG. 1, including portions of an example ITS in the non-active region according to an embodiment.

FIG. 4 is a cross-sectional view 400 of an example embodiment of the integrated circuit 100 of FIG. 1, in accordance with an embodiment. For example, the cross-sectional view 400 may be along line B-B shown in FIG. 1. In FIG. 4, like reference numerals are used to denote similar elements in FIGS. 1, 2, and 3, and some details already discussed above in conjunction with such elements are not reiterated here for brevity.

The integrated circuit 100 may include the substrate 126 that includes a first surface and a second surface. A semiconductor device in the form of one or more transistors, such as the transistor 101, within the active region 130 is formed proximate to the first surface of the substrate 126 and includes layers that support transistor operation. For example, the transistor 101 is formed in the active region 130 and may include a source contact 402 (e.g., the source structure 102 of FIG. 1), a gate 404 (e.g., the drain structure 106 of FIG. 1), a drain contact 406 (e.g., the drain structure 106 of FIG. 1). The gate 404 is formed between the source contact 402 and the drain contact 406. In some embodiments, the source contact 402 is electrically connected to the reference plane 206 through one or more standards TSVs (e.g., the standard TSVs 108 of FIG. 1). In some embodiments, the gate 404 is electrically connected to a gate pad (e.g., the gate pad 112 of FIG. 1). In some embodiments, the drain contact 406 is electrically connected to a drain pad (e.g., the drain pad 110 of FIG. 1). In some embodiments, the transistor 101 may be a GaN field effect transistor (FET). The integrated circuit 100 may include one or more transistors or other devices within the active region 130 formed proximate to the first surface of the substrate 126.

In some embodiments, multiple layers are formed at the first surface of the substrate 126, including a barrier layer 410, a channel layer 412, and a buffer layer 414. The buffer layer 414 may be formed over the first surface of substrate 126. The buffer layer 414 may include one or more group III-N semiconductor layers and is supported by substrate 126. Each of the semiconductor layers of the buffer layer 414 may include one or more epitaxially grown group III nitride layers, for example. The group-III nitride epitaxially grown layers that make up the buffer layer 414 may be N-face or Ga-face material, for example. In other embodiments, the semiconductor layers of the buffer layer 414 may not be epitaxially grown. In still other embodiments, the semiconductor layers of the buffer layer 414 may include Si, GaAs, InP, or other suitable materials.

In some embodiments, the buffer layer 414 may include at least one AlGaN mixed crystal layer having a composition denoted by $Al_XGa_{1-X}N$ with an aluminum mole fraction, X, that can take on values between 0 and 1. The total thickness of the buffer layer 414 with all of its layers may be between about 200 angstroms and about 100,000 angstroms although other thicknesses may be used. A limiting X value of 0 yields pure GaN while a value of 1 yields pure AlN. In an embodiment, the buffer layer 414 may include a nucleation region comprised of AlN. The nucleation region starts at the interface between the substrate 126 and buffer layer 414 and extends about 100 angstroms to about 2000 angstroms into the buffer layer 414. The buffer layer 414 may include additional $Al_XGa_{1-X}N$ layers formed over the nucleation region. The thickness of the additional $Al_XGa_{1-X}N$ layer(s) may be between about 100 angstroms and about 50,000 angstroms though other thicknesses may be used. In an embodiment, the additional $Al_XGa_{1-X}N$ layers may be configured as GaN (X=0) where the $Al_XGa_{1-X}N$ is not intentionally doped (NID). The additional $Al_XGa_{1-X}N$ layers may also be configured as one or more GaN layers where the one or more GaN layers are intentionally doped with dopants that may include iron (Fe), chromium (Cr), carbon (C) or other suitable dopants that render the buffer layer 414 substantially insulating or highly resistive. The dopant concentration may be between about $10^{17}$ cm$^{-3}$ and about $10^{19}$ cm$^{-3}$ though other higher or lower concentrations may be used. The additional $Al_XGa_{1-X}N$ layers may be configured with X=0.01 to 0.10 where the $Al_XGa_{1-X}N$ is NID or, alternatively, where the $Al_XGa_{1-X}N$ is intentionally doped with Fe, Cr, C, or other suitable dopant species. In other embodiments, the additional layers may be configured as a superlattice where the additional layers include a series of alternating NID or doped $Al_XGa_{1-X}N$ layers where the value of X takes a value between 0 and 1. In still other embodiments, the buffer layer 414 may also include one or more indium gallium nitride (InGaN) layers, with composition denoted $In_YGa_{1-Y}N$, where Y, the indium mole fraction, may take a value between 0 and 1. The thickness of the InGaN layer(s) may be between about 50 angstroms and about 2000 angstroms though other thicknesses may be used. The buffer layer 414 attenuates the lattice mismatch between the substrate 126 and the channel layer 412, for example.

In some embodiments, the channel layer 412 is formed over the buffer layer 414. The channel layer 412 may include one or more group III-N semiconductor layers and is supported by the buffer layer 414. The channel layer 412 may include an $Al_XGa_{1-X}N$ layer where X takes on values between 0 and 1. In an embodiment, the channel layer 412 is configured as GaN (X=0) although other values of X may be used. The thickness of the channel layer 412 may be between about 50 angstroms and about 10,000 angstroms, though other thicknesses may be used. The channel layer 412 may be NID or, alternatively, may include Si, germanium (Ge), C, Fe, Cr, or other suitable dopants. The dopant concentration may be between about $10^{16}$ cm$^{-3}$ and about $10^{19}$ cm$^{-3}$ though other higher or lower concentrations may be used. In other embodiments, the channel layer 412 may include NID or doped In$_Y$Ga$_{1-Y}$N, where Y, the indium mole fraction, may take a value between 0 and 1.

In some embodiments, the barrier layer 410 is formed over the channel layer 412. The barrier layer 410 may include one or more group III-N semiconductor layers and is supported by the channel layer 412. The barrier layer 410 may have a larger bandgap and/or larger spontaneous polarization than the channel layer 412. When the barrier layer 410 is over the channel layer 412, a channel is created in the form of a two-dimensional electron gas (2-DEG) within the channel layer 412 adjacent the interface between the channel layer 412 and the barrier layer 410. In addition, tensile strain between the barrier layer 410 and the channel layer 412 may cause additional piezoelectric charge to be introduced into the 2-DEG and the channel. In some embodiments, the barrier layer 410 may include at least one NID Al$_X$Ga$_{1-X}$N layer where X takes on values between 0 and 1. In some embodiments, X may take a value of 0.1 to 0.35, although other values of X may be used. The thickness of the NID Al$_X$Ga$_{1-X}$N layer of the barrier layer 410 may be between about 50 angstroms and about 1000 angstroms though other thicknesses may be used. The barrier layer 410 may be NID or, alternatively, may include Si, Ge, C, Fe, Cr, or other suitable dopants. The dopant concentration may be between about $10^{16}$ cm$^{-3}$ and about $10^{19}$ cm$^{-3}$ though other higher or lower concentrations may be used. There may be an additional AlN interbarrier layer (not shown) formed between the channel layer 412 and the barrier layer 410, in some embodiments. The AlN interbarrier layer may introduce additional spontaneous and piezoelectric polarization, increasing the channel charge and improving the electron confinement of the resultant 2-DEG. In other embodiments, the barrier layer 410 may include indium aluminum nitride (InAlN) layers, denoted In$_Y$Al$_{1-Y}$N, where Y, the indium mole fraction, may take a value between about 0.1 and about 0.2 though other values of Y may be used. In the case of an InAlN barrier, the thickness of the barrier layer 410 may be between about 50 angstroms and about 2000 angstroms though other thicknesses may be used. In the case of using InAlN to form the barrier layer 410, the InAlN may be NID or, alternatively, may include Si, Ge, C, Fe, Cr, or other suitable dopants. The dopant concentration may be between about $10^{16}$ cm$^{-3}$ and about $10^{19}$ cm$^{-3}$ though other higher or lower concentrations may be used.

In some embodiments, a cap layer (not shown) may be formed over the barrier layer 410. The cap layer presents a stable surface and serves to protect the upper surface of the integrated circuit 100 from chemical and environmental exposure incidental to wafer processing. The cap layer may include one or more group III-N semiconductor layers and is supported by the barrier layer 410. In an embodiment, the cap layer includes GaN. The thickness of the cap layer may be between about 5 angstroms and about 100 angstroms though other thicknesses may be used. The cap layer may be NID or, alternatively, may include Si, Ge, C, Fe, Cr, or other suitable dopants. The dopant concentration may be between about $10^{16}$ cm$^{-3}$ and about $10^{19}$ cm$^{-3}$ though other higher or lower concentrations may be used.

In some embodiments, an insulating layer 408 may be formed over the substrate 126 and may include one or more dielectric layers. In some embodiments, portions of the insulating layer 408 are formed on the barrier layer 410. In some embodiments, portions of the insulating layer 408 provide electrical insulation between the source contact 402 and the gate 404 and between the gate 404 and the drain contact 406.

The ITS 116 is located in the non-active region 128. As described above, the ITS 116 includes first buffer layer structures 302 and second buffer layer structures 304. Each of the first buffer layer structures 302 and the second buffer layer structures 304 includes a respective portion of the buffer layer 414, where each such portion of the buffer layer 414 supports a corresponding portion of the channel layer 412 formed thereon, and where each portion of the channel layer 412 supports corresponding portion of the barrier layer 410. The insulating layer 408 is formed over the first buffer layer structures 302 and the second buffer layer structures 304. Each of the first buffer layer structures 302 and the second buffer layer structures 304 are separated by high resistivity material 306. The high resistivity material 306 may also electrically isolate the active area 130 from the inactive area 128 and, in other embodiments, from other transistor structures (not shown). In some embodiments, the high resistivity material 306 may be formed by ion-implantation that damages the portions of the barrier layer 410 and channel layer 412, rendering these layers high resistivity or semi-insulating. In other embodiments (not shown), high resistivity material may be achieved by using an etch technique (e.g. dry etching) to remove the barrier layer 410 and the channel layer 412, and, optionally, some or all of the buffer layer 414. The portions of the buffer layer 414 included in first and second buffer layer structures 302 and 304 are formed in the same processing step as the portion of the buffer layer 414 included in the active region 130, such that the concentration and distribution of nonidealities (e.g., traps such as electron traps or hole traps caused by vacancies, interstitials, or anti-sites) in the portions of the buffer layer 414 located in the active region 130 is similar to the concentration and distribution of such non-idealities in the portions of the buffer layer 414 located in the non-active region 128. Thus, properties such as conductivity or resistivity of the first and second buffer layer structures 302 and 304 are likely correlated (negatively correlated for conductivity and positively correlated for resistivity) to the isolation between structures of the buffer layer 414 in the active region 130, such that the portions of the buffer layer 414 in the active region 130 can be validated via measurement the ITS 116 (e.g., via an embodiment of the validation process described above in connection with FIG. 1). While the ITS 116 is shown in the present example to be disposed directly on the substrate 126, it should be understood that one or more other layers of material (not shown), such as stress compensating transition layers, may be interposed between the substrate 126 and the ITS 116, in some embodiments.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program. The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An integrated circuit comprising:
   a substrate that includes a first surface and a second surface;
   a pad disposed over the first surface of the substrate;
   a buffer layer disposed over the substrate, the buffer layer having a first portion and a second portion;
   an isolation test structure that includes a plurality of buffer layer structures formed from the first portion of the buffer layer, wherein the plurality of buffer structures includes:
      a first plurality of buffer layer structures coupled to the pad; and
      a second plurality of buffer layer structures that are laterally interdigitated with the first plurality of buffer layer structures and that are laterally separated from the first plurality of buffer layer structures by high resistivity material; and
   a first through-substrate via (TSV) that extends between the first surface of the substrate and the second surface of the substrate, wherein the second plurality of buffer layer structures are coupled to the first TSV.

2. The integrated circuit of claim 1, further comprising:
   a semiconductor device comprising the second portion of the buffer layer, wherein a resistance of the isolation test structure correlates to a level of electrical isolation at the second portion of the buffer layer.

3. The integrated circuit of claim 2, wherein the semiconductor device comprises a second TSV that extends between the first surface of the substrate and the second surface of the substrate, wherein a first opening in the substrate corresponding to the first TSV is smaller than a second opening in the substrate associated with the second TSV.

4. The integrated circuit of claim 3, further comprising:
   a reference plane disposed at the second surface of the substrate, wherein the first TSV couples the isolation test structure to the reference plane and the second TSV couples the semiconductor device to the reference plane.

5. The integrated circuit of claim 4, further comprising:
   a fiducial marker disposed at the first surface of the substrate, wherein the fiducial marker overlaps the first TSV.

6. A test structure comprising:
   an isolation test structure disposed on a substrate comprising:
      a first plurality of buffer layer structures disposed over the substrate and coupled to a pad that is disposed over the substrate; and
      a second plurality of buffer layer structures disposed over the substrate, disposed adjacent to the first buffer layer structure, laterally interdigitated with the first plurality of buffer layer structures, laterally separated from the first plurality of buffer layer structures by high resistivity material, and coupled to a reference plane.

7. The test structure of claim 6, wherein the first plurality of buffer layer structures and the second plurality of buffer layer structures each comprise group III nitride material.

8. The test structure of claim 6, further comprising:
   a through-substrate via (TSV) that extends between a first surface of the substrate and a second surface of the substrate, wherein the TSV is coupled to the second plurality of buffer layer structures and the reference plane.

9. An integrated circuit comprising:
   a substrate that includes a first surface and a second surface;
   a buffer layer disposed over the substrate, the buffer layer having a first portion and a second portion;
   an isolation test structure that includes a plurality of buffer layer structures formed from the first portion of the buffer layer, wherein the plurality of buffer layer structures includes:
      a first plurality of buffer layer structures; and
      a second plurality of buffer layer structures that are laterally interdigitated with the first plurality of buffer layer structures and that are laterally separated from the first plurality of buffer layer structures by high resistivity material; and
   a semiconductor device comprising the second portion of the buffer layer, wherein a resistance of the isolation test structure correlates with a level of electrical isolation at the second portion of the buffer layer.

10. The integrated circuit of claim 9, wherein the buffer layer comprises epitaxially grown group III nitride material.

11. The integrated circuit of claim 9, further comprising:
   a pad disposed at the first surface of the substrate, wherein the pad is coupled to the first plurality of buffer layer structures.

12. The integrated circuit of claim 11, further comprising:
a first through-substrate via (TSV) that extends between the first surface of the substrate and the second surface of the substrate, wherein the first TSV is coupled to the second plurality of buffer layer structures.

13. The integrated circuit of claim 12, further comprising:
a second TSV that extends between the first surface of the substrate and the second surface of the substrate, wherein the first TSV is associated with a first opening in the substrate, the second TSV is associated with a second opening in the substrate, and the first opening is smaller than the second opening.

14. The integrated circuit of claim 13, wherein the semiconductor device comprises the second TSV.

15. The integrated circuit of claim 14, further comprising:
a reference plane disposed at the second surface of the substrate, wherein the first TSV couples the isolation test structure to the reference plane and the second TSV couples the semiconductor device to the reference plane.

16. The integrated circuit of claim 15, wherein the isolation test structure and the first TSV are arranged in series between the pad and the reference plane.

17. The integrated circuit of claim 12, further comprising:
a fiducial marker disposed at the first surface of the substrate in contact with and overlapping the first TSV.

18. The integrated circuit of claim 1, wherein the high resistivity material has a resistivity of between $10^4$ Ω-cm and $10^6$ Ω-cm.

\* \* \* \* \*